(12) United States Patent  
Lin

(10) Patent No.: US 7,565,595 B2
(45) Date of Patent: Jul. 21, 2009

(54) CONVOLUTIONAL INTERLEAVING AND DE-INTERLEAVING CIRCUIT AND METHOD THEREOF

(75) Inventor: Chia-Chun Lin, Nantou (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 560 days.

(21) Appl. No.: 11/315,442

(22) Filed: Dec. 21, 2005

(65) Prior Publication Data

US 2007/0061667 A1    Mar. 15, 2007

(30) Foreign Application Priority Data

Sep. 13, 2005   (TW)   .............................. 94131427 A

(51) Int. Cl.
*H03M 13/00*   (2006.01)
(52) U.S. Cl. ..................... 714/755; 714/760; 714/774
(58) Field of Classification Search ................. 714/755, 714/760, 766, 774, 702; 375/262
See application file for complete search history.

(56) References Cited

U.S. PATENT DOCUMENTS

| | | | | |
|---|---|---|---|---|
| 3,652,998 | A | | 3/1972 | Forney, Jr. ............... 340/172.5 |
| 5,537,420 | A | | 7/1996 | Huang ........................ 714/701 |
| 5,572,532 | A | * | 11/1996 | Fimoff et al. ............... 714/702 |
| 5,592,492 | A | | 1/1997 | Ben-Efraim et al. ........ 714/702 |
| 6,411,654 | B1 | * | 6/2002 | Furutani et al. ............. 375/262 |
| 6,957,310 | B1 | * | 10/2005 | Ikeda et al. ................. 711/157 |
| 7,308,618 | B2 | * | 12/2007 | Urard et al. ................. 714/702 |

* cited by examiner

*Primary Examiner*—Scott T Baderman
*Assistant Examiner*—Fritz Alphonse
(74) *Attorney, Agent, or Firm*—J.C. Patents

(57) ABSTRACT

A convolutional interleaving and de-interleaving circuit and the method thereof are provided. The convolutional interleaving and de-interleaving circuit includes an initial address generator, a first address generator, a second address generator, an address mixer, an adder, a controller and a memory. Wherein, the controller enables those address generators to provide or store corresponding channel addresses. Further, an adder is shared and memory addresses are appropriately arranged so as to reduce the requirement of registers. Accordingly, the required gate count and the chip layout area can be reduced.

14 Claims, 6 Drawing Sheets

| channel | Channel data delay time | range | bits that memory address needs |
|---|---|---|---|
| A(0) | 17*11=187 | <256 | 8 |
| B(1) | 17*10 =170 | <256 | 8 |
| C(2) | 17*9 =153 | <256 | 8 |
| D(3) | 17*8 =136 | <256 | 8 |
| E(4) | 17*7 =119 | <128 | 7 |
| F(5) | 17*6 =102 | <128 | 7 |
| G(6) | 17*5 = 85 | <128 | 7 |
| H(7) | 17*4 = 68 | <128 | 7 |
| I(8) | 17*3 = 51 | <64 | 6 |
| J(9) | 17*2 = 34 | <64 | 6 |
| K(10) | 17*1 = 17 | <32 | 5 |
| L(11) | 17*0 = 0 | 0 | 1 |

FIG. 4A

| | |
|---|---|
| | 0 |
| channel H 68 | 68 |
| channel A 187 | 255 |
| | 256 |
| channel G 85 | 341 |
| channel B 170 | 511 |
| | 512 |
| channel F 102 | 614 |
| channel C 153 | 767 |
| | 768 |
| channel E 119 | 887 |
| channel D 136 | 1023 |
| | 1024 |
| channel K 17 | 1041 |
| channel J 34 | 1075 |
| | 1088 |
| channel I 51 | 1138 |
| | 1139 |
| channel L 1 | 1140 |

FIG. 4B

CONVOLUTIONAL INTERLEAVING AND DE-INTERLEAVING CIRCUIT AND METHOD THEREOF

CROSS-REFERENCE TO RELATED APPLICATION

This application claims the priority benefit of Taiwan application serial no. 94131427, filed on Sep. 13, 2005. All disclosure of the Taiwan application is incorporated herein by reference.

BACKGROUND OF THE INVENTION

1. Field of Invention

The present invention relates to an interleaving and de-interleaving circuit. More particularly, the present invention relates to a convolutional interleaving and de-interleaving circuit and method applicable for the Digital Video Broadcast (DVB) system.

2. Description of Related Art

The technology of convolutional interleaving circuit and convolutional de-interleaving circuit is widely used in the fields of telecommunication, as Global System for Mobile communication (GSM), Synchronous Digital Hierarchy (SDH), Digital Video Broadcast-Terrestrial (DVB-T). Such technology is used mainly to prevent the data transmission channel from the interference of noise.

During data transmission, noise or some unsatisfactory effects of the channels often causes data errors. Previously, the method of Error Correcting Code (ECC), such as Hamming Code, was used to correct errors. However, the ECC has a limitation for the number of error bits. When unsatisfactory effects of the channels cause too many errors or continuous error bits, the ECC can not correct the errors. To avoid continuous error bits and too many errors within the same data, it is necessary to use the technology of convolutional interleaving circuit and convolutional de-interleaving circuit.

FIG. 1 is a schematic block diagram of a conventional convolutional interleaving circuit and convolutional de-interleaving circuit. Referring to FIG. 1, the block 101 is the convolutional interleaving circuit and the convolutional de-interleaving circuit is block 102. The convolutional interleaving circuit 101 includes a serial to parallel converting device 111, a plurality of shift registers 121 and a parallel to serial converting device 131. The convolutional de-interleaving circuit 102 includes a serial to parallel converting device 112, a plurality of shift registers 122 and a parallel to serial converting device 132.

When a serial input data D_IN inputs to the convolutional interleaving circuit 101, the serial input data D_IN will go through the serial to parallel converting device 111 first to be converted into parallel data, which are the outputs 0~31 of the serial to parallel converting device 111, respectively. Wherein, the data "0" is outputted to the parallel to serial converting device 131 directly, the data "1" is outputted to the shift register 121; after delaying for a preset time, the data "1" is outputted to the parallel to serial converting device 131. The data "2" is outputted to the shift register 121, after delaying for one preset time, the data "2" is outputted to the next shift register 121; and after delaying for another preset time, the data "2" is outputted to the parallel to serial converting device 131. Similarly, the data "31" is outputted to the parallel to serial converting device 131 after delaying for 31 times of the preset time. The parallel to serial converting device 131 receives the data 0~31, converts the data 0~31 to the serial output data D_OUT and outputs it.

Similarly, the convolutional de-interleaving circuit 102 works under the same principle. The serial input data D_IN will go through the serial to parallel converting device 112 first to be converted into parallel data 0~31. The difference is that the data "0" is delayed for 31 times of the preset time, and the data "30" is delayed for one preset time while the data "31" is not delayed. However, a great number of the shift registers in the integrated circuit will result in a waste of the area.

U.S. Pat. No. 5,537,420 proposed a convolutional interleaving and convolutional de-interleaving circuit as shown in FIG. 2. The circuit includes N address accumulators 200, an address selector 202, a memory 204 and a controller 206. These address accumulators 200 provide address pointers to the address selector 202. The address selector 202 selects an address pointer from one of the address accumulators 200 as the memory address. The memory 204 writes the data into the memory or reads the data from the memory according to the reading/writing commands of the controller 206 and the memory address from the address selector 202. Basically, the above described patent utilizes a random access memory to implement convolutional interleaving and convolutional de-interleaving circuit.

Compared to the conventional architecture shown in FIG. 1, the architecture saves a lot of gate counts. Take the Digital Video Broadcast-Terrestrial (DVB-T) system as an example, there are about 60K transistor used as shown in FIG. 1. In the U.S. Pat. No. 5,537,420, only 2K transistors are used. However, the U.S. Pat. No. 5,537,420 still has to use a lot of adders and high bit registers that unavoidably increases a lot of unnecessary gate counts and limits the chip layout.

SUMMARY OF THE INVENTION

Accordingly, the present invention is directed to provide a convolutional interleaving and convolutional de-interleaving circuit to decrease the gate count so as to achieve the purpose of reducing the chip layout area.

The present invention is also directed to provide a convolutional interleaving and convolutional de-interleaving circuit which will save the manufacturing cost.

The present invention provides a convolutional interleaving and convolutional de-interleaving circuit that comprises an initial address generator, a first address generator, a second address generator, an address mixer, an adder, a controller and a memory. The initial address generator provides a plurality of initial addresses receives an initial control signal and an accumulating address and outputs one of said initial addresses and said accumulating address according to the initial control signal. The first address generator receives a first control signal and an output from the initial address generator, registers the output of the initial address generator and outputs a first address according to the first control signal. The second address generator provides a plurality of basic addresses, receives a second control signal, and outputs a second address from one of the basic addresses according to the second control signal. The address mixer receives the first address and the second address and synthesizes these two addresses to a third address. The adder receives the first address and accumulates a preset value to the first address as an accumulating address. The memory receives the input data and the third address and accesses the input data according to the third address. The controller receives the accumulating address, controls the memory for accessing the input data according to the accumulating address, and outputs the initial control signal, the first control signal and the second control signal.

The convolutional interleaving and de-interleaving circuit according to a preferred embodiment of the present invention, the Most Significant Bit (MSB) of the third address described above is the second address, while the Least Significant Bit (LSB) of the third address is the first address.

The present invention proposes a method of convolutional interleaving and de-interleaving circuit, comprising: provide N registers; at the meantime, a preset value, a basic address and an initial address are provided to each of the registers; and provide a memory; first of all, taking out the address registered in the $J^{th}$ register, synthesizing with the corresponding basic address to a synthesized address; accessing an input data in the memory according to the synthesized address; adding a preset address to the address stored in the $J^{th}$ register; when the result of the adding is greater than the preset value of the end address corresponding to the $J^{th}$ register, store the $J^{th}$ initial address to the $J^{th}$ register; otherwise, store the added result to the $J^{th}$ register, wherein N, J are all natural numbers.

The method of convolutional interleaving and de-interleaving circuit according to the preferred embodiment of the present invention, the Least Significant Bit (LSB) of the synthesized address described above is the address stored in the $J^{th}$ register, while the Most Significant Bit (MSB) of the synthesized address is the basic address corresponding to the $J^{th}$ register.

In the present invention, an adder is commonly shared and memory addresses are appropriately arranged, the requirement of registers is thus reduced. Accordingly, the required gate count and the chip layout area can be reduced.

In order to the make the aforementioned and other objects, features and advantages of the present invention comprehensible, a preferred embodiment accompanied with figures is described in detail below.

It is to be understood that both the foregoing general description and the following, detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4A shows the number of bits for each channel when performing convolutional interleaving to the Digital Video Broadcast-Terrestrial (DVB-T) system.

FIG. 4B shows the internal configuration of memory when a convolutional interleaving circuit applies to the DVB-T system according to the embodiment of the present invention.

DESCRIPTION OF EMBODIMENTS

Figure 3:
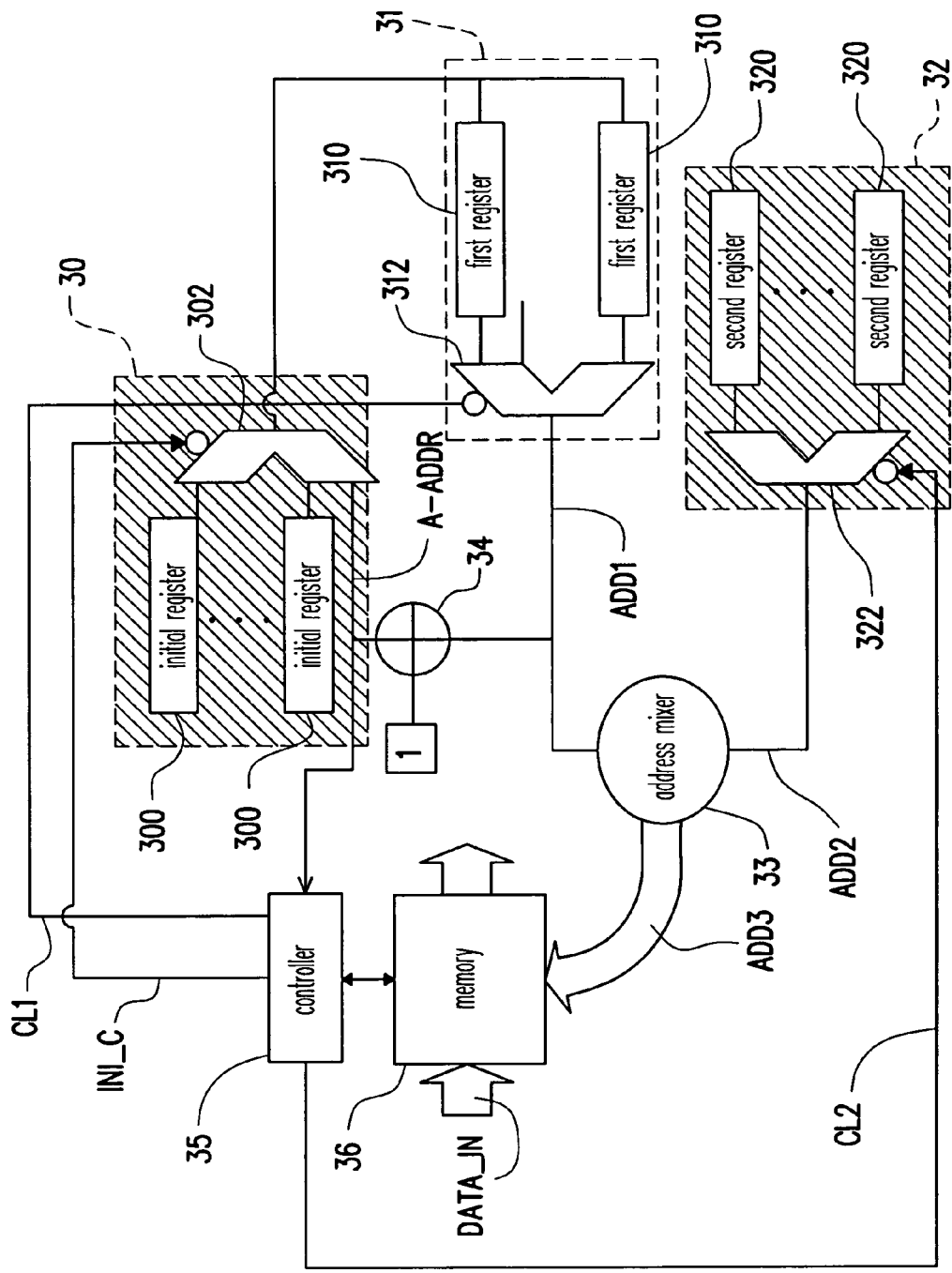
FIG. 3 is a schematic block diagram of a convolutional interleaving circuit and convolutional de-interleaving circuit according to the embodiment of the present invention.

FIG. 3 is a schematic block diagram of a convolutional interleaving circuit and convolutional de-interleaving circuit according to the embodiment of the present invention. Referring to FIG. 3, the circuit comprises an initial address generator 30, a first address generator 31, a second address generator 32, an address mixer 33, an adder 34, a controller 35 and a memory 36.

Wherein, the initial address generator 30 includes a plurality of initial registers 300 and an initial selector 302. The first address generator 31 includes a plurality of first registers 310 and a first selector 312. The second address generator 32 includes a plurality of second registers 320 and a second selector 322.

A plurality of initial registers 300 of the initial address generator 30 store a plurality of initial addresses respectively. The initial selector 302 of the initial address generator 30 receives an initial control signal INI_C from the controller 35 and an accumulating address A_ADDR from the adder 34, outputs from either one of the initial addresses or accumulating address A_ADDR according to the initial control signal INI_C. The first selector 312 within the first address generator 31 receives the first control signal CL1 from the controller 35, the first registers 310 of the first address generator 31 receive and store the output signals from the initial address generator 30, and the first selector 312 selectively outputs the addresses stored in the first registers according to the first control signal CL1 as the first address ADD1.

A plurality of second registers 320 of the second address generator 32 store a plurality of basic addresses respectively. The second selector 322 of the second address generator 32 receives a second control signal CL2, and outputs one of the plurality basic addresses according to the second control signal CL2 as the second address ADD2. The address mixer 33 receives the first address ADD1 and the second address ADD2, and synthesizes these two addresses to a third address ADD3. The adder 34 receives the first address ADD1 and accumulates 1 to the first address ADD1 to be an accumulating address A_ADDR (accumulating 1 in the embodiment, but does not restrict herein). The memory 36 receives the input data DATA_IN and the third address ADD3, and accesses the input data DATA_IN according to the third address ADD3. The controller 35 receives the accumulating address A_ADDR to control the memory for accessing the input data DATA_IN according to the accumulating address A_ADDR, and outputs the initial control signal INI_C, the first control signal CL1 and the second control signal CL2 to control the initial address generator 30, the first address generator 31 and the second address generator 32.

The embodiment of the present invention can apply to the Digital Video Broadcast-Terrestrial system (DVB-T), for example. As shown in FIG. 4, there are 12 channels including A~L, wherein the data in the $A^{th}$ channel needs to be delayed for 187 units of time, the data in the $B^{th}$ channel needs to be delayed for 170 units of time. The configuration of the memory 36 can be implemented as the method in FIG. 4B. The description of the embodiment of the present invention will be given below by the application of the DVB-T. However, the present invention will not be restricted to the application of the DVB-T. In addition, according to different applications, the configuration of the memory may be not the same and the present invention does not restrict herein.

According to the application in FIG. 4A, for example, the memory 36 can be configured in the method as shown in FIG. 4B. Referring to FIG. 4B, addresses 0~67 are used to store channel H, 68~255 are used to store channel A, 256~341 are used to store channel G and so on. Such that it can be calculated that 1140 bytes are required in total. It is known after calculation that 11 bits are required to express the memory address, for example, address 1088=10001000000. Thus, the address for all the channels can be defined as an initial address, an end address and a basic address. Due to the variance of the addresses of channel H and channel A is between 00000000 (0) and 11111111 (255), and the Most Significant Bit (MSB) has not changed, we can define that the initial address for channel H is as 00000000, the end address as 01000011 and the basic address is defined as the Most Significant Bit (MSB) 000.

Similarly, the initial address of channel G is 256, converted to binary, it is 00100000000; in the embodiment, the initial address is defined as 00000000, the basic address is defined as the Most Significant Bit (MSB) 001. In addition, the end address of channel G is 340, converted to binary, it is 00101010100; in the embodiment, the end address is defined as 01010100. According to the same principle, we can define the initial address for channel B as 01010101, the basic address for channel B as 001 and the end address for channel B is 11111111. The third party should be able to get the results of the rest by following the same principle.

The configuration of the memory in FIG. 4B is not the only best configuration; it shall be obvious to those skilled in the art. For example, exchanging channel H and channel A with channel G and channel B can be implemented, too. The difference is that the basic addresses are not the same, the basic address for channel H and channel A changes to 001, while the basic address for channel G and channel B changes to 000. Additionally, the basic address implemented is not necessarily with 3 bits, for example, the variance of address for channel K is between 10000000000 and 10000010001. Accordingly, the basic address for channel K can be defined as 100000. Therefore, the embodiment of the present invention is not the only one embodiment; the embodiment is exemplified for illustration only, the present invention does not restrict herein.

The following will describe the operation of the circuit shown in FIG. 3 according to the application of FIG. 4 mentioned above. Please refer to FIGS. 3~4 together. First, assuming there are 12 groups in the first registers 310 to handle channels A~L respectively. Then, assuming there are 8 groups in the initial registers 300. Within the memory, as the initial addresses assigned to channel H is 0, to channel G is 256, to channel F is 512, to channel E is 768, to channel K is 1024, thus the addresses assigned to these channels have a common characteristic that only the basic addresses are different while the initial addresses are the same. For example, the initial address assigned to channel G expressed in binary is 00100000000, and to channel E is 01100000000. As the initial addresses are the same for these channels, the initial registers can be shared.

Similarly, in the embodiment, assuming there are 6 groups in total in the second registers 320 used to store the basic addresses. As in the embodiment, channel H and channel A use the same basic address 000, channel G and channel B use the same basic address 001, channel F and channel C use the same basic address 010, channel E and channel D use the same basic address 011, channel K and channel J use the same basic address 100, channel I and channel L use the same basic address 10001. Wherein, the total number of variable bits for channel K and channel L is 6 bits 000000~110100, that the initial registers 300 and the first registers 310 corresponding to channel K and channel L, need the registers with 6 bits only.

At the beginning of the operation of the convolutional interleaving and convolutional de-interleaving circuit according to the embodiment of the present invention, the controller 35 outputs the initial control signal INI_C to the initial selector 302 to control the initial selector 302 to select storing the initial register 300 of the initial address (01000100) of channel A. In addition, the initial address (01000100) stored in the initial register 300 is stored to a first register 310, which is exclusive for channel A. Then, the controller 35 outputs the first control signal CL1 to control the first selector 312, takes out the address 01000100 from the first register 310 which is exclusive for channel A, and outputs it as the first address ADD1. In addition, the first address ADD1=01000100 is transmitted to the adder 34 and the address mixer 33. The first address ADD1 is accumulated 1 by the adder 34 and becomes the accumulating address A_ADDR=01000101 which is transmitted to the initial registers 300 and the controller 35. And then the controller 35 outputs the second control signal CL2 to control the second selector 322 selecting the basic address 000 stored in the second register corresponding to channel A, and outputs it as the second address ADD2.

The address mixer 33 synthesizes the first address ADD1 (101000100) and the second address ADD2 (000) to the third address ADD3 (0000100010) and outputs it to the memory 36. Then the controller 35 outputs the reading control signal RD to the memory 36. After receiving the reading control signal RD, the memory 36 outputs the data stored in the third address ADD3 (00001000100). And then the controller 35 outputs the writing control signal WT to the memory 36. After receiving the writing control signal WT, the memory 36 stores the input data DATA_IN in the third address ADD3 (00001000100). Later, the controller 35 judges if the accumulating address A_ADDR (01000101) is greater than the end address (11111111). If the controller 35 determines that the answer is "NO", then output the initial control signal INI_C to control the initial selector 302 for outputting the accumulating address A_ADDR (01000101) and storing it to the first register 310 corresponding to channel A.

Next, the method implemented in channel B is similar to that in channel A. The controller 35 outputs the initial control signal INI_C to the initial selector 302 to control the initial selector 302 to select storing the initial register 300 of the initial address (01010110) of channel B, and stores the initial address (01010110) stored in the initial register 300 to a first register 310 which is exclusive for channel B. Then, the controller 35 outputs the first control signal CL1 to control the first selector 342, and takes out the address 01010110 from the first register 310 which is exclusive for channel B as the first address ADD1. In addition, the first address ADD1=01010110 is transmitted to the adder 34 and the address mixer 33. The first address ADD1 is accumulated 1 by the adder 34 and becomes the accumulating address A_ADDR=01010111 which is transmitted to the initial register 300 and the controller 35. And then the controller 35 outputs the second control signal CL2 to control the second selector 322 selecting the basic address 001 stored in the second register corresponding to channel B, and outputs it as the second address ADD2.

The address mixer 33 synthesizes the first address ADD1 (01010110) and the second address ADD2 (001) to the third address ADD3 (001010101110) and outputs the third address ADD3 to the memory 36. Then the controller 35 outputs the reading control signal RD to the memory 36. After receiving the reading control signal RD, the memory 36 outputs the data stored in the third address ADD3 (00101010110). And then the controller 35 outputs the writing control signal WT to the memory 36. After receiving the writing control signal WT, the memory 36 stores the input data DATA_IN in the third address ADD3 (0010101010110). Later, the controller 35 judges if the accumulating address A_ADDR (01010111) is greater than the end address (11111111). Similarly, if the controller 35 determines that the answer is "NO", then output the initial control signal INI_C to control the initial selector 302 for outputting the accumulating address A_ADDR (01010111) and storing it to the first register 310 corresponding to channel B. The operations are repeated until the initial operations of channel L are completed. The subsequent operations should be able to be inferred.

After initialization, the normal operation is started. The controller 35 outputs the first control signal CL1 to control the first selector 312, takes out the address, for example, (70) 01000110 from the first register 310 which is exclusive for channel A, and outputs it as first address ADD1. In addition, the first address ADD1=01000110 is transmitted to the adder 34 and the address mixer 33. The first address ADD1 is accumulated 1 by the adder 34 and becomes the accumulating address A_ADDR=01000111 which is transmitted to the initial register 300 and the controller 35. And then the controller 35 outputs the second control signal CL2 to control the second selector 322 selecting the basic address 000 stored in the second register corresponding to channel A, and outputs it as the second address ADD2.

The address mixer 33 synthesizes the first address ADD1 (010000110) and the second address ADD2 (000) to the third address ADD3 (00001000110) and outputs the third address ADD3 to the memory 36. Then the controller 35 outputs the reading control signal RD to the memory 36. After receiving the reading control signal RD, the memory 36 outputs the data stored in the third address ADD3 (00001000110). And then the controller 35 outputs the writing control signal WT to the memory 36. After receiving the writing control signal WT, the memory 36 stores the input data DATA_IN in the third address ADD3 (00001000110). Later, the controller 35 judges if the accumulating address A_ADDR (01000111) is greater than the end address (11111111). Similarly, if the controller 35 determines that the answer is "NO", then output the initial control signal INI_C to control the initial selector 302 for outputting the accumulating address A_ADDR (01000111) and storing it to the first register 310 corresponding to channel A. The following operations in channels B~L should be able to be inferred.

When the accumulating address A_ADDR is greater than the end address, for example, the address stored in the first register 310 which is exclusive for channel A is 11111111 (255), then, the controller 35 outputs the first control signal CL1 to control the first selector 312, takes out the address 11111111 stored in the first register 310 which is exclusive for channel A, and outputs it as the first address ADD1. In addition, the first address ADD1=11111111 is transmitted to the adder 34 and the address mixer 33. The first address ADD1 is accumulated by 1 by the adder 34 and becomes the accumulating address A_ADDR=100000000 (256) which is transmitted to the initial register 300 and the controller 35. And then the controller 35 outputs the second control signal CL2 to control the second selector 322 selecting the basic address 000 stored in the second register corresponding to channel A, and outputs it as the second address ADD2.

The address mixer 33 synthesizes the first address ADD1 (11111111) and the second address ADD2 (000) to the third address ADD3 (00011111111) and outputs the third address ADD3 (00011111111) to the memory 36. Then the controller 35 outputs the reading control signal RD to the memory 36. After receiving the reading control signal RD, the memory 36 outputs the data stored in the third address ADD3 (00011111111). And then the controller 35 outputs the writing control signal WT to the memory 36. After receiving the writing control signal WT, the memory 36 stores the input data DATA_IN in the third address ADD3 (00011111111). Later, the controller 35 judges if the accumulating address A_ADDR (100000000) is greater than the end address (11111111). If the controller 35 determines that the answer is "YES", then output the initial control signal INI_C to control the initial selector 302 for outputting the accumulating address A_ADDR (01000100) and storing it to the first register 310 corresponding to channel A. The operations of the other channels are similar to that of channel A.

Figure 1:
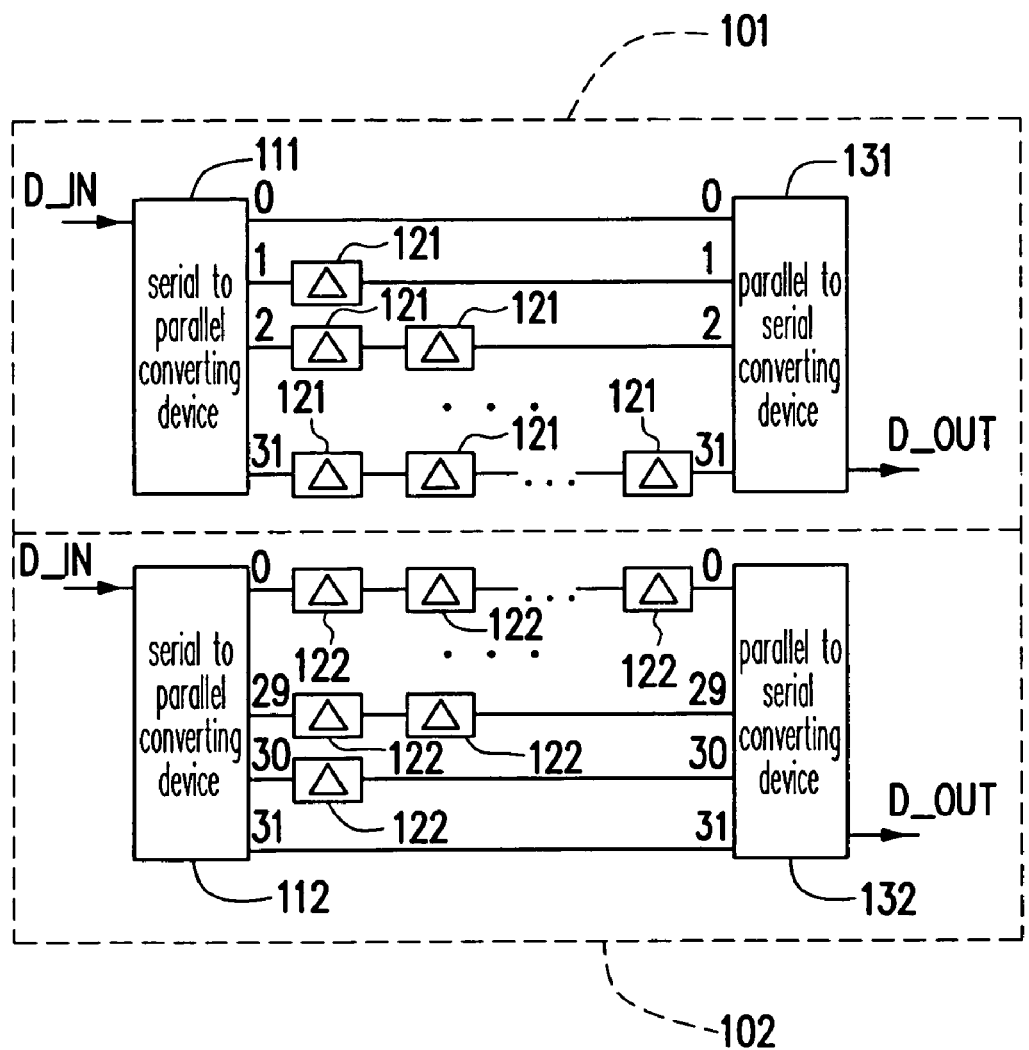
FIG. 1 is a schematic block diagram of a conventional convolutional interleaving circuit and convolutional de-interleaving circuit.
Figure 2:
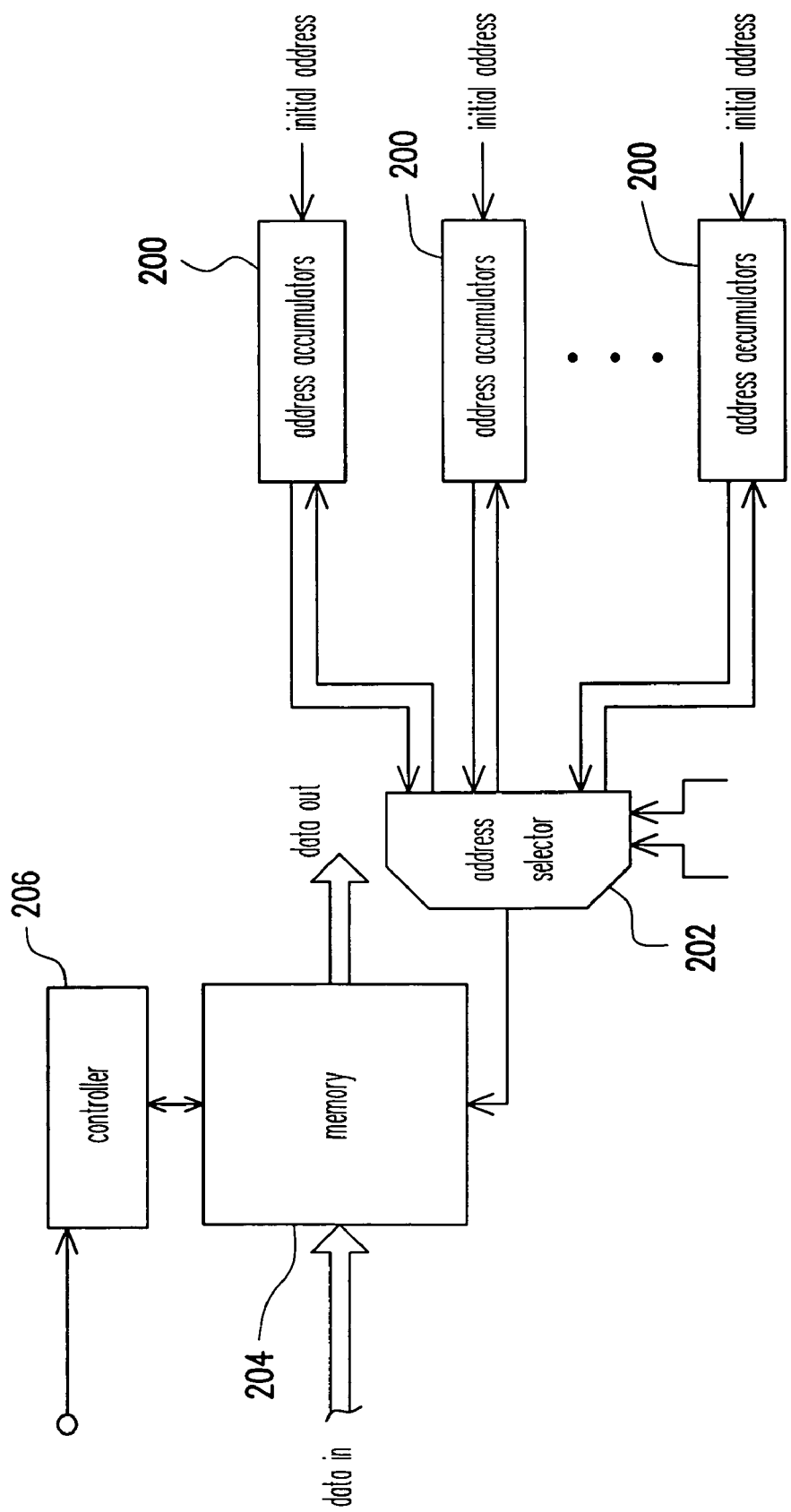
FIG. 2 is a schematic block diagram of a conventional convolutional interleaving circuit and convolutional de-interleaving circuit according to U.S. Pat. No. 5,537,420.

Comparing the above embodiment with the prior art in FIG. 2, it is found that there are a lot of registers in FIG. 2 while only one adder is needed in the embodiment. In addition, by arranging appropriately memory addresses can reduce the requirement of registers. Though the embodiment of the present invention applies to the Digital Video Broadcast-Terrestrial (DVB-T) system, the conventional technology requires only 1122 bytes of the memory, while the present invention requires 1140 bytes of the memory which means more waste on the application of memory compared with the conventional technology. However, for the 0.18 manufacturing process for example, the best size of memory compiled by the Artisan Memory Compiler is 1152 bytes according to the layout area which is greater than 1140 bytes required by the present invention. Accordingly, the present invention does not waste the layout area. In addition, in the above embodiment of FIG. 3, those skilled in the art should know easily that the initial address generator 30 and the second address generator 32 can be implemented by look up tables; so the details are omitted here.

Figure 5:
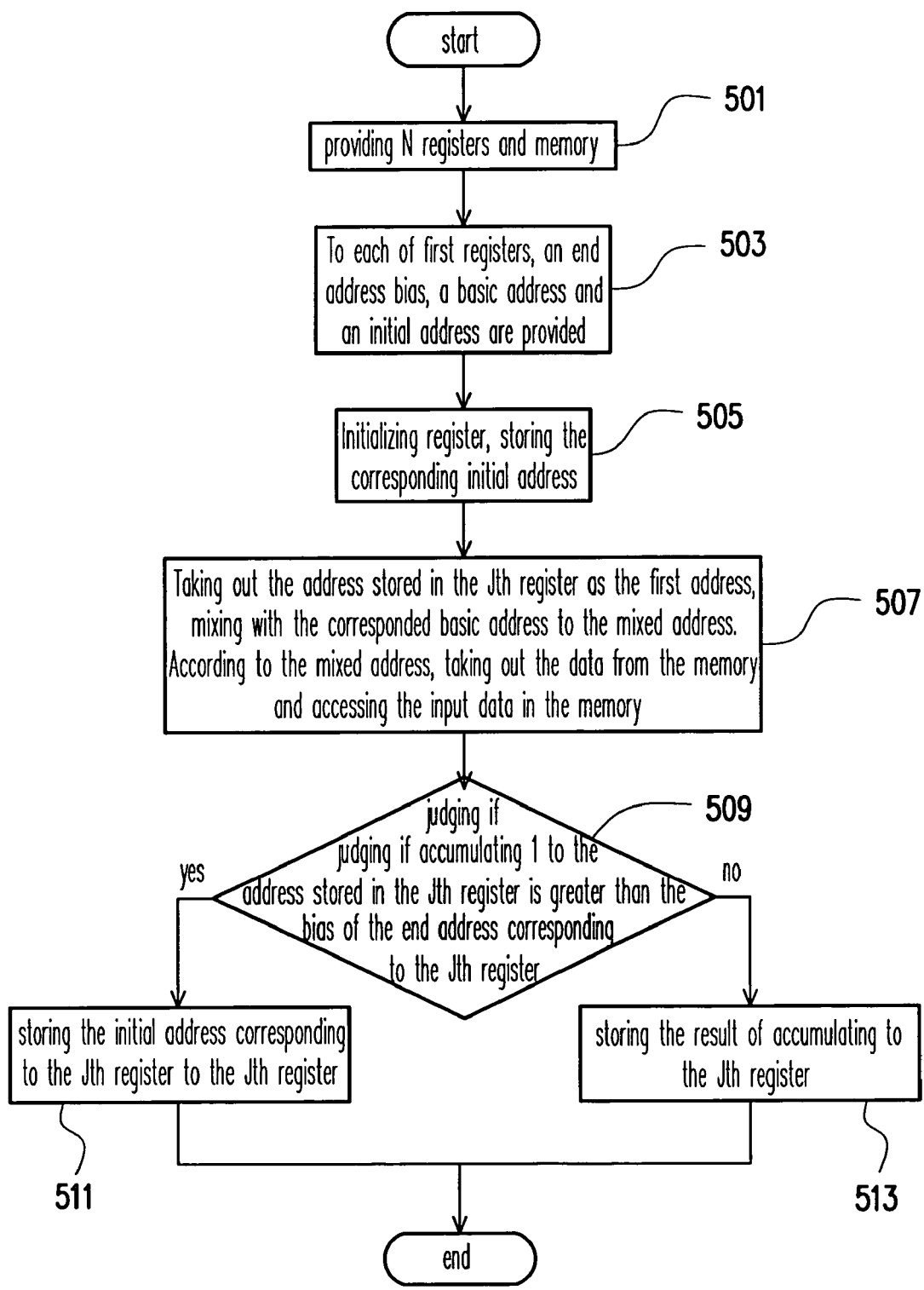
FIG. 5 is a flowchart of the convolutional interleaving and convolutional de-interleaving circuit according to the embodiment of the present invention.

The above convolutional interleaving and convolutional de-interleaving circuit according to the embodiment of the present invention, after induction and summarization, a method for convolutional interleaving and convolutional de-interleaving circuit is provided. FIG. 5 is a flowchart of the convolutional interleaving and convolutional de-interleaving circuit according to the embodiment of the present invention. Referring to FIG. 5 and FIG. 3, first, providing N registers 310 and memory (step 501); to each of the first registers 310, an end address preset value, a basic address and an initial address are provided (step 503); when initialization, every register 310 stores the corresponding initial address (step 505).

Then, taking out the address stored in the $J^{th}$ register as the first address ADD1, synthesizing with the corresponding basic address ADD2 to the synthesized address ADD3. According to the synthesized address ADD3, take out the data from the memory and access the input data DATA_IN in the memory (step 507). Accumulate 1 to the address stored in the $J^{th}$ register (it's 1 in the embodiment, but the present invention does not restrict herein), judge if the result is greater than the preset value of the end address corresponding to the $J^{th}$ register (step 509). If the result of accumulation is greater than the preset value of the end address corresponding to the $J^{th}$ register, store the initial address corresponding to the $J^{th}$ register to the $J^{th}$ register (step 511). Otherwise, store the result of the accumulation to the $J^{th}$ register (step 513). Wherein, N, J are all natural numbers, and the Least Significant Bit (LSB) of the synthesized address ADD3 is the address stored in the $J^{th}$ register, and the Most Significant Bit (MSB) of the synthesized address is the basic address corresponding to the $J^{th}$ register.

In conclusion, as a shared adder is utilized in the present invention, and by arranging appropriately memory addresses, the requirement of registers is lowered and the required gate count and the chip layout area are also reduced. Hence, the manufacturing cost can be saved.

While the present invention has been particularly shown and described with reference to exemplary embodiments thereof, it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A convolutional interleaving and de-interleaving circuit, comprising:
   an initial address generator, which provides a plurality of initial addresses, receives an initial control signal and an accumulating address, and outputs one of said initial addresses and said accumulating address according to said initial control signal;
   a first address generator, which receives a first control signal and an output from said initial address generator, registers an output of said initial address generator and outputs a first address according to said first control signal;
   a second address generator, which provides a plurality of basic addresses, receives a second control signal, and outputs a signal as a second address from one of said basic addresses according to said second control signal;
   an address mixer, which receives said first address and said second address, synthesizes these two addresses to a third address;
   an adder, which receives said first address, accumulates a preset value to said first address as said accumulating address;
   a memory, which receives an input data and said third address, to access said input data according to said third address; and
   a controller, which receives said accumulating address to control said memory for accessing said input data according to said accumulating address, and outputs said initial control signal, said first control signal and said second control signal.

2. The convolutional interleaving and de-interleaving circuit as claimed in claim 1, wherein said second address generator is a look up table.

3. The convolutional interleaving and de-interleaving circuit as claimed in claim 1, wherein said initial address generator is a look up table.

4. The convolutional interleaving and de-interleaving circuit as claimed in claim 1, wherein said initial address generator comprising:
   a plurality of initial registers, each of said initial registers stores said initial addresses respectively; and
   an initial selector, which receives said initial addresses and said accumulating addresses from said initial registers, and outputs one of said initial addresses and said accumulating addresses according to said initial control signal.

5. The convolutional interleaving and de-interleaving circuit as claimed in claim 4, wherein said first address generator comprising:
   a plurality of first registers, which receive the outputs of said initial selectors; and
   a first selector, which receives the output of said first registers and said first control signal, outputs the data stored in one of said first registers according to said first control signal as said first address.

6. The convolutional interleaving and de-interleaving circuit as claimed in claim 1, wherein said second address generator comprising:
   a plurality of second registers, which store the said basic addresses; and
   a second selector, which receives said basic addresses output from said second registers and said second control signal, outputs one of said basic addresses according to said second control signal as said second address.

7. The convolutional interleaving and de-interleaving circuit as claimed in claim 1, wherein Most Significant Bit (MSB) of said third address is said second address, while Least Significant Bit (LSB) of said third address is said first address.

8. The convolutional interleaving and de-interleaving circuit as claimed in claim 1, wherein the preset value is 1.

9. The convolutional interleaving and de-interleaving circuit as claimed in claim 5, wherein said controller outputs said first control signal to control said first selector, outputs the data stored in one of said first registers as said first address, and outputs said second control signal to control said second address generator, outputs the basic addresses corresponding to said second registers as said second address, and controls said memory for accessing an input data according to said third address, and receives said accumulating address; when said accumulating address is greater than an end address, output said first control signal to control said first selector and store the basic address corresponding to said register to said register; when said accumulating address is less than or equal to said end address, output said first control signal to control said first selector and stores said accumulating address to said register.

10. A method for convolutional interleaving and de-interleaving, the method being suitable for a convolutional interleaving and de-interleaving circuit, and comprising:
    providing a plurality of registers;
    providing an end address preset value, a basic address and an initial address to each of said registers correspondingly;
    providing a memory;
    taking out the address stored in the $j^{th}$ register of the plurality of registers, synthesize with the corresponding basic address to a synthesized address;
    accessing an input data in the memory according to the synthesized address; and
    accumulating a preset address value to the address stored in the $j^{th}$ register, if the accumulating result is greater than said end address preset value corresponding to said $j^{th}$ register, store the initial address corresponding to the $j^{th}$ register to the $j^{th}$ register;
    otherwise, store the accumulating result to the $j^{th}$ register,
    wherein J is a positive integer.

11. The method as claimed in claim 10, wherein said address preset value is 1.

12. The method as claimed in claim 10, wherein Least Significant Bit (LSB) of said synthesized address is the address stored in the $j^{th}$ register, the Most Significant Bit (MSB) of said synthesized address is the basic address corresponding to the $j^{th}$ register.

13. The method as claimed in claim 10, wherein said memory is random access memory.

14. The method as claimed in claim 10, further comprising, during initialization, every said register stores the corresponding said initial address.

* * * * *